United States Patent [19]

Botka

[11] Patent Number: 5,539,305
[45] Date of Patent: Jul. 23, 1996

[54] CALIBRATION BOARD FOR AN ELECTRONIC CIRCUIT TESTER

[76] Inventor: Julius K. Botka, 5120 Carriage La., Santa Rosa, Calif. 95403

[21] Appl. No.: 316,984

[22] Filed: Oct. 3, 1994

[51] Int. Cl.$^6$ .................................................. G01R 35/00
[52] U.S. Cl. .................. 324/158.1; 324/601; 364/571.01
[58] Field of Search ....................... 324/758, 73.1, 324/754, 74, 158.1, 130, 601; 364/571.01

[56] References Cited

U.S. PATENT DOCUMENTS

| | | | |
|---|---|---|---|
| 4,918,374 | 4/1990 | Stewart | 324/758 |
| 4,980,636 | 12/1990 | Romanofsky et al. | 324/601 |
| 5,477,137 | 12/1995 | Staudinger et al. | 324/158.1 |

OTHER PUBLICATIONS

Engen, G. F., and Hoer, C. A., "'Thru-Reflect-Line': An Improved Technique for Calibrating the Dual Six-Port Automatic Network Analyzer," IEEE Trans. Microwave Theory Tech., vol. MTT-27, No. 12, Dec., 1979, pp. 987-993.

*Primary Examiner*—Ernest F. Karlsen
*Assistant Examiner*—Russell M. Kobert

[57] ABSTRACT

An electronic circuit tester for measuring the response of electrical signals applied to an electronic circuit under test is provided with a calibration board for effecting calibration of the tester to the plane of connectors incorporated into a test head of the tester. The calibration board includes a dielectric substrate, calibration standards, such as opens, shorts, and loads, mounted to the substrate in respective regions of the substrate, connectors for electrically connecting the calibration standards to the connectors of the test head when the calibration board is selectively substituted for a fixture board, structure for mounting the calibration board to the test head so that electrical connection is established between the calibration board and the test head, and indicia on the calibration board and the test head for indicating a sequence of rotational positions of the calibration board for calibration of the tester using the calibration standards. The calibration board is sequentially rotated to the indicated rotational positions so that the tester can be calibrated to the plane of the connectors of the test head. The calibration board can further include at least one verification standard mounted to the substrate and can alternatively include through connections.

8 Claims, 4 Drawing Sheets

CALIBRATION BOARD FOR AN ELECTRONIC CIRCUIT TESTER

BACKGROUND OF THE INVENTION

This invention relates to systems for testing electronic circuits by applying and/or measuring electrical signals and, more particularly, to electronic circuit test systems for applying electrical signals to a packaged device or integrated circuit, or a device or integrated circuit chip on wafer, and measuring the response of the device or integrated circuit to the applied electrical signals. Specifically, one embodiment of the invention provides a calibration board for electrical connection to a test head of an electronic circuit tester for calibrating the tester to the plane of the test head. The calibration board in accordance with one embodiment of the invention is particularly adaptable to a high-frequency electronic circuit tester for effecting calibration of the tester for increasing precision of subsequent measurements of the response of the device or integrated circuit during actual testing, as well as for facilitating the setup and calibration of, and measurements with, the tester for testing high-frequency devices and integrated circuits, thereby improving reliability and enhancing overall throughput.

Programmable electronic circuit testers are typically used during the manufacture of electronic devices and integrated circuits to test the performance of the device or integrated circuit being manufactured. Tests are conducted to assure that the device or integrated circuit satisfies associated design performance specifications. In order to test the device or integrated circuit, the electronic circuit tester is programmed to inject an electrical signal or suite of electrical signals into the device or integrated circuit under test and to measure the response(s). The electronic circuit tester cannot only be used to test finished packaged devices and integrated circuits, but is also frequently used to perform tests at various stages of manufacture of the device or integrated circuit between initial wafer processing and final packaging.

A conventional programmable electronic circuit tester, generally indicated by the numeral 10, is shown in FIG. 1. The electronic circuit tester 10 comprises a test head 12 electrically connected by cables routed through a conduit 14 to a rack(s) 16 of electronic test and measurement instruments, such as ac and dc electrical signal generators for applying electrical signals to a device or integrated circuit interfaced to the test head, and signal analyzers, for example, an oscilloscope and a network analyzer, for measuring the response(s) to those applied electrical signals. As shown in FIG. 1, the test head 12 interfaces to a device or integrated circuit through a load board 18 connected to the cables in the conduit 14 and fixture board 20 in turn connected to the load board. Alternatively, prior to installation of the fixture board 20, a calibration board is preferably connected to the test head 12 for calibrating the electronic circuit tester 10. The configuration of the load board 18 depends on the type of device or integrated circuit being tested, such as an analog or digital electronic circuit, while the configuration of the fixture board 20 is typically specific to the family of device or integrated circuit being tested.

As shown in FIG. 1, the test head 12 is mounted on a dolly 22. Since the electronic circuit tester 10 can be employed to test both packaged devices and integrated circuits, as well as device or integrated circuit chips on wafer, the test head 12 is preferably mounted by pivotable connections 24 to the dolly 22. The pivotable connections 24 enable the test head 12 to be positioned in an approximately upward facing horizontal position so that the appropriate load board 18 and calibration or fixture board 20 can be mounted on the test head of the electronic circuit tester 10 by an operator. After calibration, the fixture board 20 is substituted for the calibration board, and the test head 12 can be pivoted to a vertical position so that the fixture board can interface with a material handler, for example, to test packaged devices or integrated circuits. Finally, the test head 12 can be pivoted to a downward facing horizontal position so that the fixture board 20 can interface with a wafer to test device or integrated circuit chips on the wafer.

Typically, calibration of the electronic circuit tester 10 has been performed with various calibration standards connected serially to connectors incorporated into the test head 12. This is a tedious procedure. Moreover, high-frequency coaxial connectors are relatively fragile, and the center conductor of such a connector can be damaged if caution is not exercised by the operator when connections are effected.

It would therefore be desirable to provide a calibration structure to efficiently calibrate the electronic circuit tester 10 during setup and calibration of the tester. Additionally, it is desirable to provide a relatively rugged calibration structure which is less susceptible to damage when connection is effected. Such a calibration structure would facilitate the use of the electronic circuit tester 10 to perform setup and calibration of the tester.

SUMMARY OF THE INVENTION

One embodiment of the invention provides a calibration board for interconnection to a test head of an electronic circuit tester for calibrating the tester. The calibration board in accordance with one embodiment of the invention comprises calibration standards, such as opens, shorts, and loads, as well as at least one verification standard. Alternatively, the calibration board in accordance with another embodiment of the invention comprises through connections. The calibration board is connected to the test head which is in turn connected to means for applying an electrical signal or suite of electrical signals to, and measuring the response(s) of, the calibration standards, verification standard, and/or through connections of the calibration board. Calibration can include the use of both a calibration board having the calibration standards and verification standard, as well a calibration board having the through connections.

In accordance with one embodiment of the invention, a calibration board for calibrating the electronic circuit tester including a test head having connectors for S electrical connection to a fixture board in turn connected to an electronic device or integrated circuit to be tested, the connectors of the test head being disposed approximately in a plane, comprises a dielectric substrate. For example, the substrate can be printed circuit board material. The calibration board further comprises a plurality of calibration standards mounted to the substrate, the calibration standards being mounted in respective regions of the substrate, the calibration standards comprising opens, shorts, and loads. For example, the loads can be 50-ohm terminations. Preferably, the plurality of calibration standards is deployed in each of three respective quadrants of the substrate. The calibration board additionally comprises means for electrically connecting the calibration standards to the connectors of the test head when the calibration board is selectively substituted for the fixture board. The calibration board also comprises means for mounting the calibration board to the test head so that electrical connection is established by the means for electrically connecting the calibration standards to the connectors of the test head. Finally, the calibration board comprises means on the calibration board and the test head for indicating a sequence of rotational positions of the calibration board for calibration of the tester using the calibration standards. The calibration board is sequentially rotated to the indicated rotational positions so that the tester can be calibrated to the plane of the connectors of the test head. The calibration board can further comprise at least one verification standard mounted to the substrate. The at least one verification standard is preferably mounted to the substrate in a fourth quadrant of the substrate. For example, the at least one verification standard can be a 100-ohm resistor.

In accordance with another embodiment of the invention, a calibration board for calibrating an electronic circuit tester including a test head having connectors for electrical connection to a fixture board in turn connected to an electronic device or integrated circuit to be tested, the connectors of the test head being disposed approximately in a plane, comprises a dielectric substrate. For example, the substrate can be printed circuit board material. The calibration board further comprises a plurality of through connections mounted to the substrate, the through connections being mounted across respective regions of the substrate. The calibration board additionally comprises means for electrically connecting the through connections to the connectors of the test head when the calibration board is selectively substituted for the fixture board. The calibration board also comprises means for mounting the calibration board to the test head so that electrical connection is established by the means for electrically connecting the through connections to the connectors of the test head. Finally, the calibration board comprises means on the calibration board and the test head for indicating a sequence of rotational positions of the calibration board for calibration of the tester using the through connections. The calibration board is sequentially rotated to the indicated rotational positions so that the tester can be calibrated to the plane of the connectors of the test head.

The calibration board in accordance with the invention increases reliability and efficiency during setup and calibration of the electronic circuit tester. This speeds the measurement process.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings.

DETAILED DESCRIPTION OF THE PREFERRED EMBODIMENTS

Figure 1:
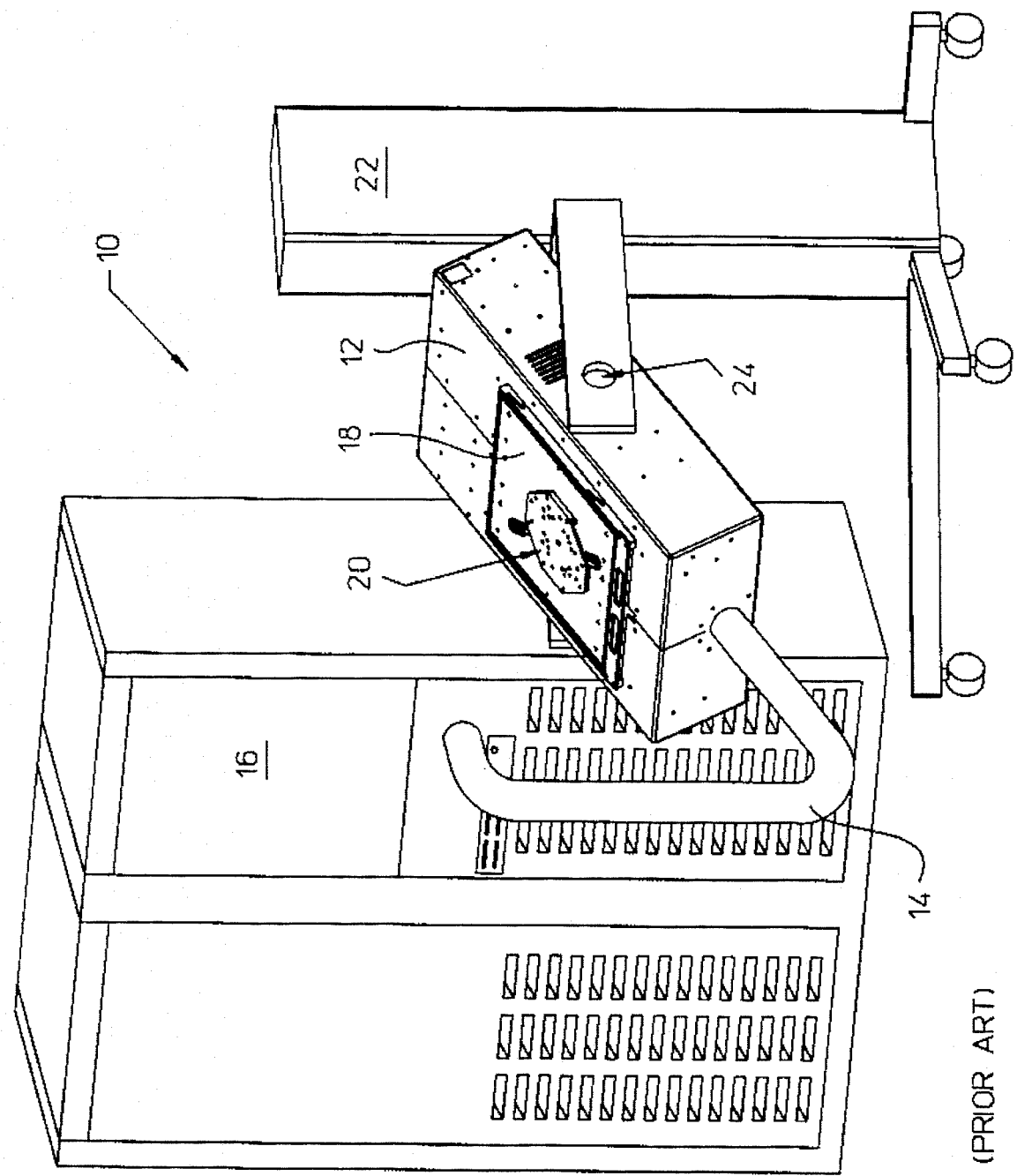
FIG. 1 is an isometric view of a conventional electronic circuit tester.
Figure 2:
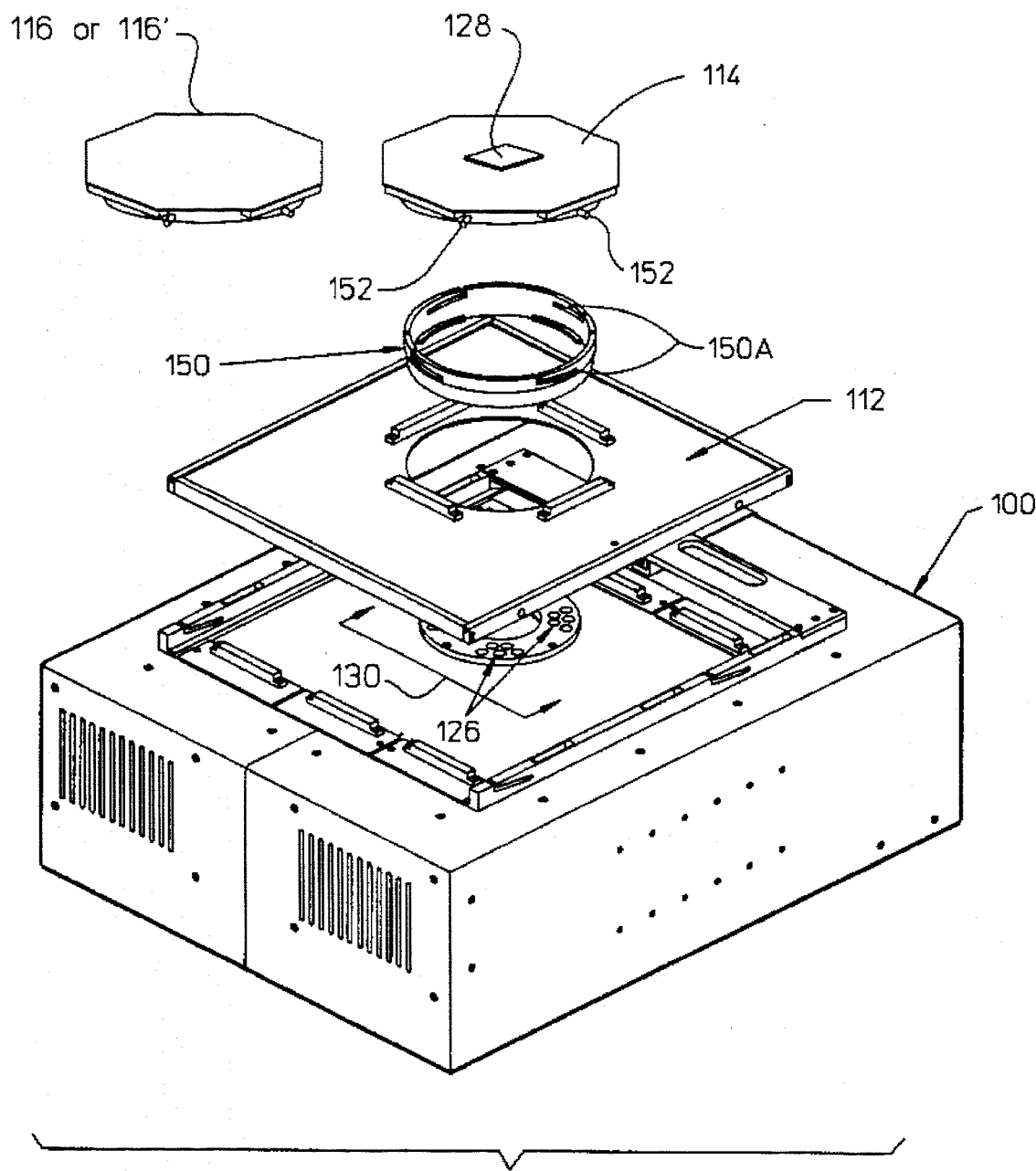
FIG. 2 is an exploded view of a test head, load board, and fixture board in the electronic circuit tester shown in FIG. 1, which incorporates the calibration board in accordance with one embodiment of the invention.

FIG. 2 shows a portion of an electronic circuit tester, namely, a test head 100, a load board 112, and a fixture board 114. As shown in FIG. 2, the test head 112 comprises connectors 126 for electrical connection to the fixture board 114 in turn connected to an electronic device or integrated circuit 128 to be tested. For example, the test head can comprise twenty connectors 126, as shown in FIG. 2. The connectors 126 of the test head 100 are disposed approximately in a plane 130. In accordance with one embodiment of the invention, a calibration board, generally indicated by the numeral 116, is substituted for the fixture board 114 for calibrating the electronic circuit tester during setup and calibration of the tester to the plane 130.

Figure 3:
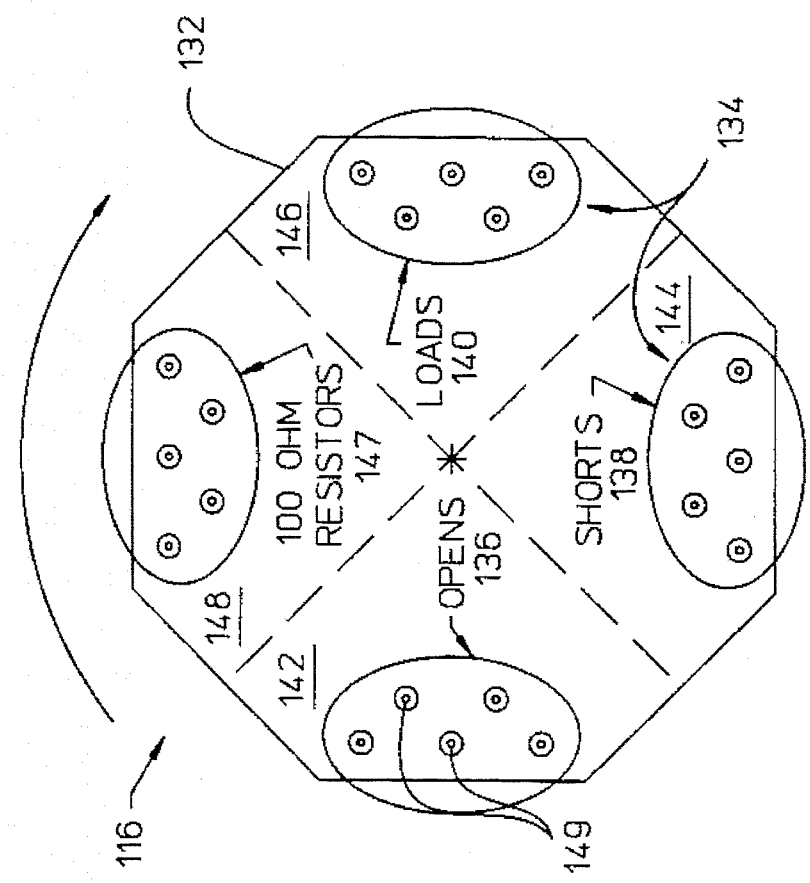
FIG. 3 is an elevational view of a calibration board in accordance with one embodiment of the invention.

Considered in more detail, the calibration board 116 comprises a dielectric substrate 132, as shown in FIG. 3. For example, the substrate 132 can be printed circuit board material.

The calibration board 116 further comprises a plurality of calibration standards 134 mounted to the substrate 132. The calibration standards comprise opens 136, shorts 138, and loads 140. For example, the loads 140 can be 50-ohm terminations.

As shown in FIG. 3, the calibration standards 134 are mounted in respective regions of the substrate 132. Preferably, the calibration standards are deployed in each of three respective quadrants 142, 144, and 146 of the substrate 132.

As shown in FIG. 3, the calibration board 116 can further comprise at least one verification standard 147 mounted to the substrate 132. The at least one verification standard 147 is preferably mounted to the substrate 132 in a fourth quadrant 148 of the substrate. For example, the at least one verification standard 147 can be a 100-ohm resistor.

The calibration board 116 additionally comprises means for electrically connecting the calibration standards 134 and the at least one verification standard 147 to the connectors 126 of the test head 100 when the calibration board is selectively substituted for the fixture board 114 mounted to the test head. Preferably, the calibration standards 134 and the at least one verification standard 147 are electrically connected to blind mate connectors 149. The blind mate connectors 149 connect to the calibration standards 134 and at least one verification standard 147 mounted to one surface of the substrate 132 and pass through the substrate beyond the other surface of the substrate for interconnection with the connectors 126 of the test head 100. For example, the blind mate connectors 149 can be the blind mate connectors disclosed in the patent application of Julius K. Botka and David R. Veteran entitled BLIND MATE CONNECTOR FOR AN ELECTRONIC CIRCUIT TESTER filed on the same date as this application, the disclosure of which is hereby incorporated herein by this reference.

The calibration board 116 also comprises means for mounting the calibration board to the test head 100 so that electrical connection is established by the means for electrically connecting the calibration standards 134 and the at least one verification standard 147 to the connectors 126 of the test head. For example, the test head 100 preferably comprises a pull down/eject ring 150 having a plurality of slots 150A. The calibration board 116 preferably comprises pins 152 which interfit in the slots 150A so that rotation of the calibration board causes axial movement of the blind mate connectors 149 toward the connectors 126 for effecting connection between the calibration board and the test head 100.

Figure 5:
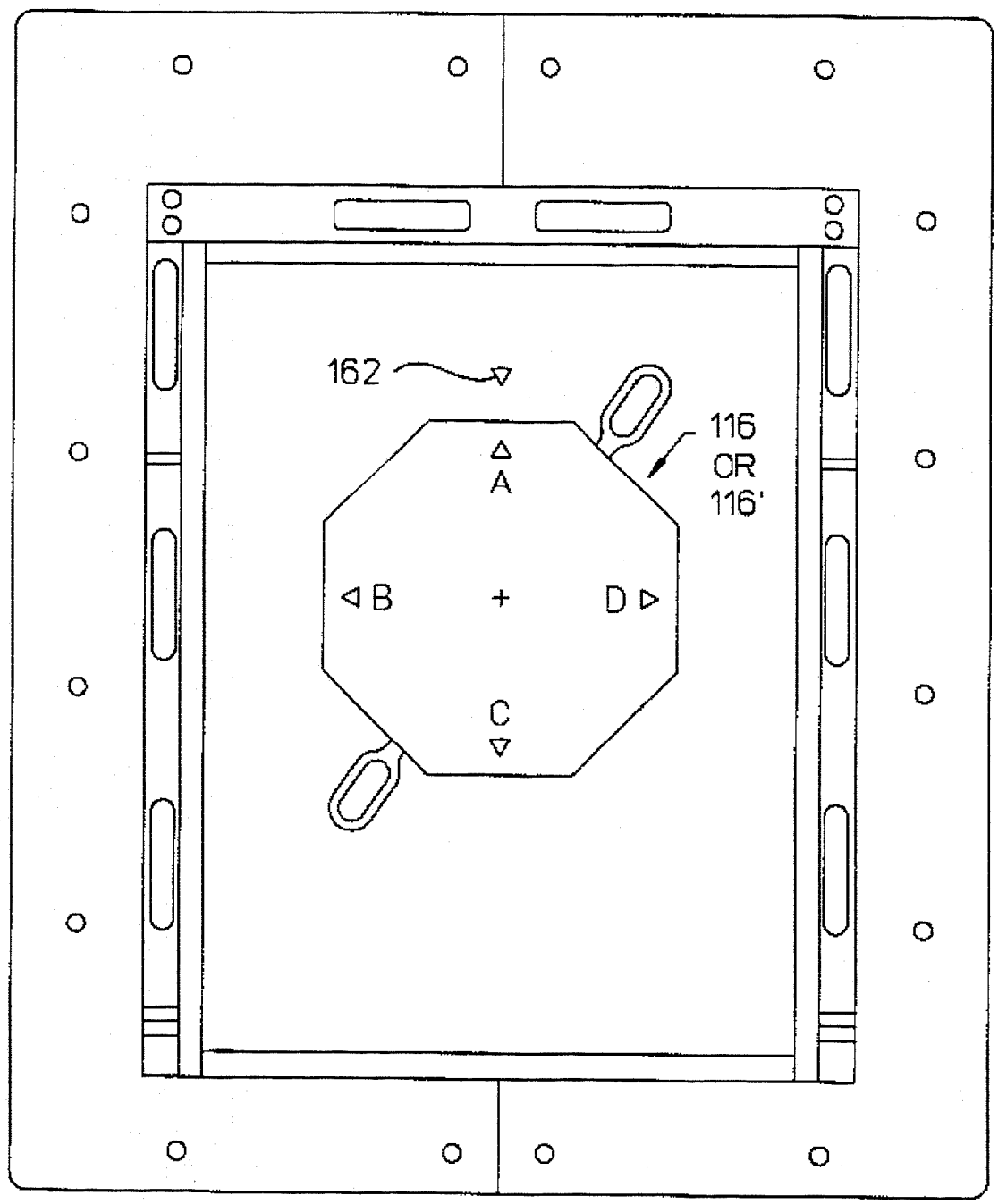
FIG. 5 is an elevational view of the calibration board shown in FIGS. 3 or 4 mounted to the test head of the electronic circuit tester.

Finally, the calibration board 116 comprises means on the calibration board 116 and the test head 100 for indicating a sequence of rotational positions of the calibration board 116 for calibration of the electronic circuit tester using the calibration standards 134 and the at least one verification standard 147. As shown in FIG. 5, the calibration board 116 is sequentially rotated to the indicated rotational positions A, B, C, and D aligned with the position arrow 162 on the test head 100 so that the electronic circuit tester can be calibrated to the plane 130 of the connectors 126 of the test head.

Figure 4:
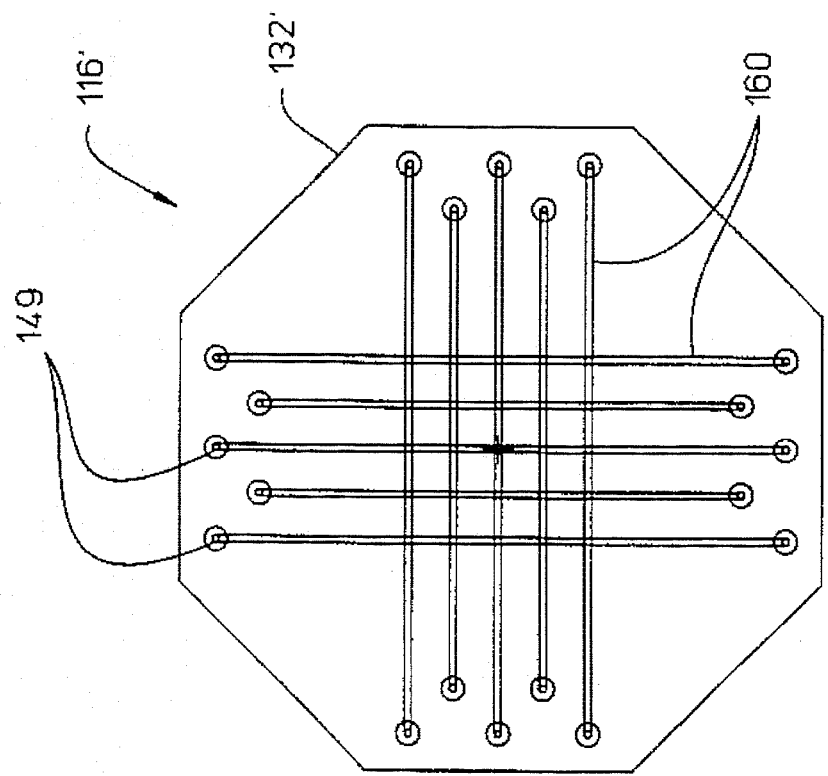
FIG. 4 is an elevational view of a calibration board in accordance with another embodiment of the invention.

In accordance with another embodiment of the invention, a calibration board 116' comprises a dielectric substrate 132' as shown in FIG. 4. For example, the substrate 132' can be printed circuit board material. The calibration board 116' further comprises a plurality of through connections 160 mounted to the substrate 132'. The through connections 160 are mounted across respective regions of the substrate 132'.

The calibration board 116' additionally comprises means for electrically connecting the through connections 160 to the connectors 126 of the test head 100 when the calibration board 116' is selectively substituted for the fixture board 114. Preferably, the through connections 160 are electrically connected to blind mate connectors 149, as described earlier. The through connections 160 can be coaxial cables connected between blind mate connectors 149.

The calibration board 116' also comprises means for mounting the calibration board 116' to the test head 100 so that electrical connection is established by the means for electrically connecting the through connections 160 to the connectors 126 of the test head 100. For example, the test head 100 preferably comprises a pull down/eject ring 150 having a plurality of slots 150A. The calibration board 116' preferably comprises pins 152 which interfit in the slots 150A so that rotation of the calibration board 116' causes axial movement of the blind mate connectors 149 toward the connectors 126 for effecting connection between the calibration board 116' and the test head 100.

Finally, the calibration board 116' comprises means on the calibration board 116' and the test head 100 for indicating a sequence of rotational positions of the calibration board 116' for calibration of the electronic circuit tester using the through connections 160. As shown in FIG. 5, the calibration board 116' is sequentially rotated to the indicated rotational positions A, B, C, and D aligned with the position arrow 162 on the test head 100 so that the electronic circuit tester can be calibrated to the plane 130 of the connectors 126 of the test head.

In operation, the calibration board 116 is installed on the test head 100. The operator selects a calibration mode of the electronic circuit tester. The electronic circuit tester recognizes which calibration standards 134 and any verification standard 147 are connected to the connectors 126 of the test head 100 as the calibration board 116 is rotated among the positions shown in FIG. 5. The calibration board 116' can next be substituted to perform through calibrations in a similar manner. The electronic circuit tester can then calculate error coefficients for subsequent measurements on a device or integrated circuit 128 to be tested. The electronic circuit tester can also apply the error coefficients to measurements on the at least one verification standard 147 and compare the results to values stored in a look-up table to determine whether or not the corrected measurements on the verification standard are within an acceptable tolerance indicative of an acceptable calibration. If the calibration is acceptable, the fixture board 114 is substituted for the calibration board 116 or 116' for actual testing of a device or integrated circuit 128.

It will be understood and appreciated that the embodiment of the present invention described above is susceptible to various additional modifications, changes, and adaptations. The calibration board in accordance with the invention can be configured to calibrate a test head having one or more ports. Also, the calibration board 116 in accordance with the invention can be configured to comprise additional calibration standards, for example, loads, in additional regions to the quadrants 142, 144, 146, and 148 shown in FIG. 3, and the calibration board would have a corresponding number of rotations for calibration. Although the foregoing description discloses an electronic circuit tester which measures high-frequency electrical signals, the principles of the invention also apply in general to calibration. All is intended to be comprehended within the meaning and range of equivalents of the appended claims.

What is claimed is:

1. A calibration board for calibrating an electronic circuit tester including a test head having connectors for electrical connection to a fixture board in turn connected to an electronic device or integrated circuit to be tested, the connectors of the test head being disposed approximately in a plane, the calibration board comprising:

a dielectric substrate;

a plurality of calibration standards mounted to the substrate, the calibration standards being mounted in respective regions of the substrate, the calibration standards comprising opens, shorts, and loads;

means for electrically connecting the calibration standards to the connectors of the test head when the calibration board is selectively substituted for the fixture board;

means for mounting the calibration board to the test head so that electrical connection is established by the means for electrically connecting the calibration standards to the connectors of the test head; and means on the calibration board and the test head for indicating a sequence of rotational positions of the calibration board for calibration of the tester using the calibration standards;

whereby the tester can be calibrated to the plane of the connectors of the test head.

2. The calibration board according to claim 1 wherein the plurality of calibration standards is deployed in each of three respective quadrants of the substrate.

3. The calibration board according to claim 2, further comprising at least one verification standard mounted to the substrate in a fourth quadrant of the substrate.

4. The calibration board according to claim 3 wherein the at least one verification standard is a 100-ohm resistor.

5. The calibration board according to claim 1 wherein the loads are 50-ohm terminations.

6. The calibration board acording to claim 1, further comprising at least one verification standard mounted to the substrate.

7. The calibration board according to claim 6 wherein the at least one verification standard is a 100-ohm resistor.

8. A calibration board for calibrating an electronic circuit tester including a test head having connectors for electrical connection to a fixture board in turn connected to an electronic device or integrated circuit to be tested, the connectors of the test head being disposed approximately in a plane, the calibration board comprising:

a dielectric substrate;

a plurality of through connections mounted to the substrate, the through connections being mounted across respective regions of the substrate;

means for electrically connecting the through connections to the connectors of the test head when the calibration board is selectively substituted for the fixture board;

means for mounting the calibration board to the test head so that electrical connection is established by the means for electrically connecting the through connections to the connectors of the test head; and means on the calibration board and the test head for indicating a sequence of rotational positions of the calibration board for calibration of the tester using the through connections;

whereby the tester can be calibrated to the plane of the connectors of the test head.

* * * * *